United States Patent
Chen et al.

(10) Patent No.: US 10,629,255 B2
(45) Date of Patent: Apr. 21, 2020

(54) PROCESSING SYSTEM AND METHOD FOR DATA STROBE SIGNAL

(71) Applicant: VIA Alliance Semiconductor Co., Ltd., Shanghai (CN)

(72) Inventors: Chen Chen, Beijing (CN); Hui Wu, Beijing (CN); Fan Jiang, Beijing (CN); Qiang Si, Beijing (CN)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 15/466,977

(22) Filed: Mar. 23, 2017

(65) Prior Publication Data

US 2018/0197588 A1 Jul. 12, 2018

(30) Foreign Application Priority Data

Jan. 9, 2017 (CN) .......................... 2017 1 0013325

(51) Int. Cl.
| | |
|---|---|
| *G11C 11/4076* | (2006.01) |
| *G11C 8/18* | (2006.01) |
| *G11C 7/10* | (2006.01) |
| *G11C 7/22* | (2006.01) |
| *G11C 11/4093* | (2006.01) |

(52) U.S. Cl.
CPC ........ *G11C 11/4076* (2013.01); *G11C 7/1066* (2013.01); *G11C 7/222* (2013.01); *G11C 11/4093* (2013.01)

(58) Field of Classification Search
CPC ..... G11C 7/1093; G11C 8/18; G11C 11/4076; G11C 11/406; G11C 11/4093; G11C 7/1066; G11C 7/222
See application file for complete search history.

(56) References Cited

U.S. PATENT DOCUMENTS

| | | | | |
|---|---|---|---|---|
| 5,521,878 A | * | 5/1996 | Ohtani ................... | G11C 7/103 365/189.05 |
| 6,215,726 B1 | * | 4/2001 | Kubo .................... | G11C 7/1006 327/141 |
| 6,252,441 B1 | * | 6/2001 | Lee ....................... | G11C 7/1051 326/94 |
| 6,629,222 B1 | * | 9/2003 | Jeddeloh .............. | G11C 7/1078 365/193 |

(Continued)

FOREIGN PATENT DOCUMENTS

CN  104272283 A  1/2015

OTHER PUBLICATIONS

Donn Stewart, Sep. 20, 2017, CPUville, Logic gates, 2017 http://cpuville.com/Educational/Logic-gates.html.*

*Primary Examiner* — Yaima Rigol

(74) *Attorney, Agent, or Firm* — McClure, Qualey & Rodack, LLP

(57) ABSTRACT

A processing system and method for a data strobe signal (DQS). A counter circuit counts falling edges of the DQS within a valid region of the DQS and thereby generates a plurality of counting signals. An OR logic circuit receives the counting signals and a DQS window start signal and thereby generates a DQS window signal. A filter circuit is provided to gate the DQS according to the DQS window signal. The DQS window start signal is kept asserted until at least one of the counting signals changes due to the counting.

19 Claims, 5 Drawing Sheets

(56) References Cited

U.S. PATENT DOCUMENTS

| | | | |
|---|---|---|---|
| 6,708,298 B2* | 3/2004 | Corbin, Jr. | G11C 7/1066 714/702 |
| 7,177,230 B1* | 2/2007 | Huang | G11C 7/1066 365/193 |
| 7,193,909 B2* | 3/2007 | Huang | G11C 7/1066 365/193 |
| 7,200,796 B2 | 4/2007 | Kim et al. | |
| 7,287,143 B2* | 10/2007 | Lee | G11C 7/1066 711/167 |
| 7,457,175 B1* | 11/2008 | Griffith | G06F 13/1689 365/193 |
| 7,543,172 B2* | 6/2009 | Kizer | G06F 13/1689 713/400 |
| 8,427,892 B2* | 4/2013 | Venkataraman | G06F 13/1689 365/193 |
| 8,630,131 B1* | 1/2014 | Shiao | G11C 5/04 326/30 |
| 9,001,595 B1* | 4/2015 | Shiao | G11C 5/04 326/21 |
| 9,166,596 B2* | 10/2015 | Chong | H03K 19/177 |
| 9,285,824 B2 | 3/2016 | Zhu et al. | |
| 9,857,973 B1* | 1/2018 | Chae | G11C 8/12 |
| 2006/0044892 A1* | 3/2006 | Hsieh | G11C 11/4072 365/193 |
| 2007/0247960 A1* | 10/2007 | Minzoni | G11C 7/1051 365/233.19 |
| 2008/0031079 A1* | 2/2008 | Osawa | G11C 7/1066 365/233.1 |
| 2009/0034346 A1* | 2/2009 | Nakashima | G06F 13/1689 365/189.15 |
| 2009/0228747 A1 | 9/2009 | Kim et al. | |
| 2010/0039870 A1* | 2/2010 | Murakami | G06F 13/4243 365/189.05 |
| 2012/0120744 A1* | 5/2012 | Yoon | G11C 7/1018 365/193 |
| 2013/0297961 A1* | 11/2013 | Zhu | G06F 1/04 713/401 |
| 2014/0334243 A1* | 11/2014 | Duffner | G11C 7/00 365/233.13 |
| 2018/0174633 A1* | 6/2018 | Lee | G11C 7/222 |

* cited by examiner

PROCESSING SYSTEM AND METHOD FOR DATA STROBE SIGNAL

CROSS REFERENCE TO RELATED APPLICATIONS

This Application claims priority of China Patent Application No. 201710013325.7, filed on Jan. 9, 2017, the entirety of which is incorporated by reference herein.

BACKGROUND OF THE INVENTION

Field of the Invention

The present invention relates to data strobe signal (DQS) processing techniques.

Description of the Related Art

When receiving read commands from a storage controller at the host side, a storage device provides the storage controller with a data signal (DQ) and a data strobe signal (DQS). According to the rising edges and/or the falling edges of the data strobe signal (DQS), the storage controller retrieves data from the data signal (DQ).

However, only the oscillations within a valid region of the data strobe signal (DQS) are provided for retrieving the data signal (DQ). It is an important issue in this technical field to correctly identify the oscillations within the valid region of the data strobe signal (DQS) so that the storage controller correctly retrieves the data transmitted from the storage device.

BRIEF SUMMARY OF THE INVENTION

Systems and methods for processing a data strobe signal (DQS) are introduced.

A data strobe signal (DQS) processing system in accordance with an exemplary embodiment of the disclosure has a counter circuit, an OR logic circuit, and a filter circuit.

A data strobe signal (DQS) is transmitted from a storage device. The counter circuit counts falling edges of a data strobe signal within a valid region of the data strobe signal and thereby outputs a plurality of counting signals. The OR logic circuit receives the plurality of counting signals and a DQS window start signal to generate a DQS window signal. The filter circuit gates the data strobe signal in accordance with the DQS window signal. The DQS window start signal is kept asserted until at least one of the counting signals changes due to the counting.

A data strobe signal (DQS) processing method in accordance with an exemplary embodiment of the disclosure comprises the following steps: counting falling edges of a data strobe signal within a valid region of the data strobe signal to generate a plurality of counting signals, wherein the data strobe signal is transmitted from a storage device; processing the plurality of counting signals and a DQS window start signal by an OR logic operation to generate a DQS window signal; and gating the data strobe signal in accordance with the DQS window signal. The DQS window start signal is kept asserted until at least one of the counting signals changes due to the counting.

Note that, instead of complex logic circuits, the aforementioned data strobe signal (DQS) processing systems and methods use simple logic gates to generate the DQS window signal to gate the data strobe signal. The simple logic gates (especially those implemented within an input and output section of the storage controller) is capable of directly receiving the data strobe signal transmitted from the storage device. No delay is introduced by the simple logic gates and it is ensured that the gating window is quickly closed in accordance with the last falling edge of the data strobe signal within the valid region. Thus, the glitch of the data strobe signal is effectively blocked.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments of carrying out the invention. This description is made for the purpose of illustrating the general principles of the invention and should not be taken in a limiting sense. The scope of the invention is best determined by reference to the appended claims.

Figure 1:
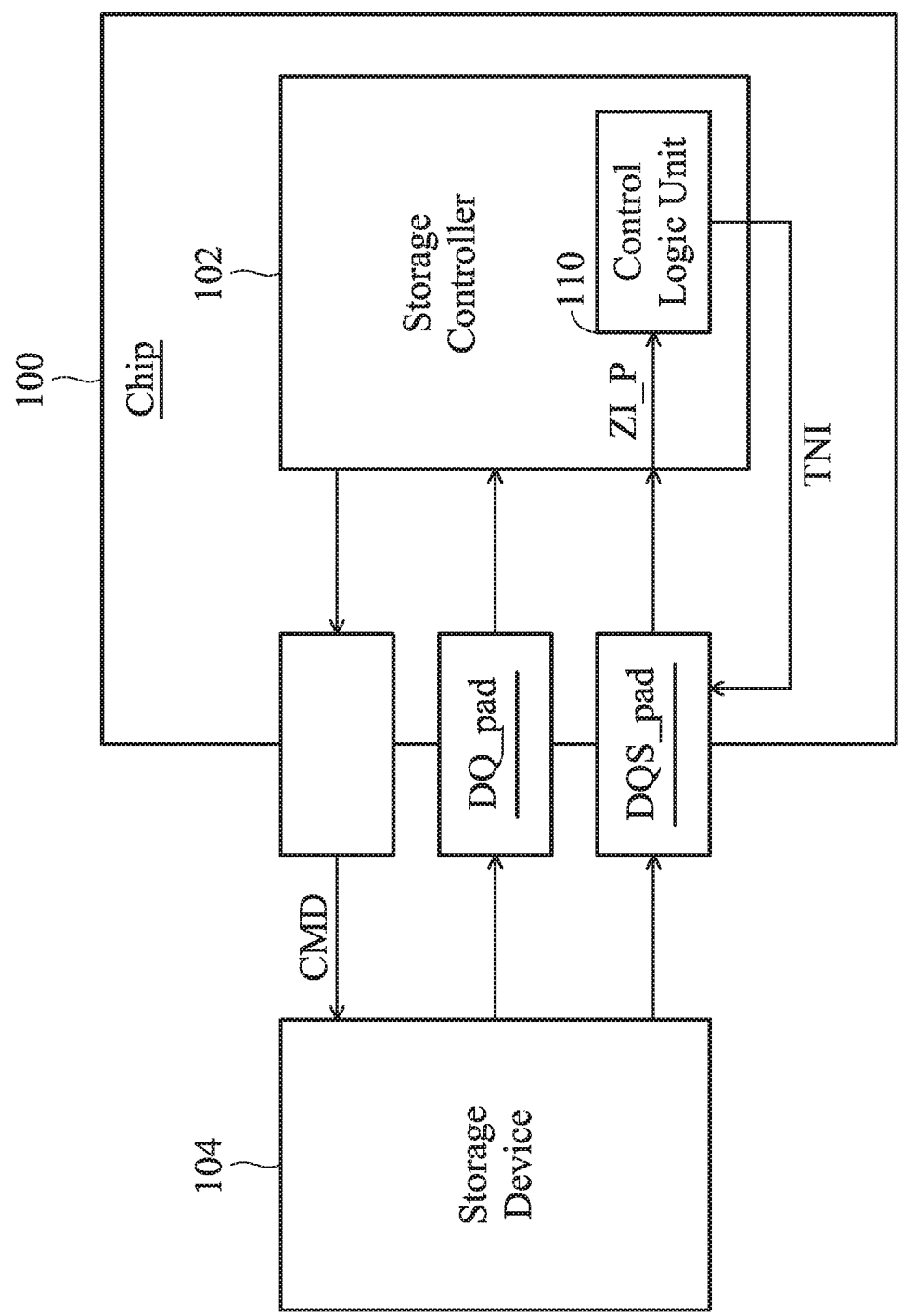
FIG. 1 illustrates a data strobe signal (DQS) processing system in accordance with an exemplary embodiment of the disclosure.

FIG. 1 illustrates a data strobe signal (DQS) processing system in accordance with an exemplary embodiment of the disclosure. The data strobe signal (DQS) processing system may be implemented within an input and output section (I/O section) of a storage controller at the host side. The input and output section may be a chip pad, named DQS_pad. A chip 100 is shown and comprises the chip pad DQS_pad. In other exemplary embodiments, a data strobe signal (DQS) processing system is implemented by the chip 100. The chip 100 may be a chipset, or an SOC (system on chip) with integrated processing unit and chipset. The chip 100 comprises a storage controller 102 controlling a storage device 104. In an exemplary embodiment, the storage device 104 is a dynamic random access memory (DRAM). The storage controller 102 is a DRAM controller.

As shown, when the storage controller 102 outputs a read command CMD to the storage device 104, the storage device 104 returns a data signal (DQ) and a data strobe signal (DQS) to be received by the storage controller 102 via the chip pads DQ_pad and DQS_pad of the chip 100. According to the disclosure, a specific circuit is provided within the chip pad DQS_pad to process the data strobe signal (DQS) before the data strobe signal (DQS) is transmitted to the storage controller 102. The storage controller 102, therefore, correctly obtains rising edges and/or falling edges within the valid region of the data strobe signal (DQS) and thereby data is correctly retrieved from the data signal (DQ) accordingly. The storage controller 102 has a control logic unit 110. As discussed in the later paragraphs, the control logic unit 110 receives a gated data strobe signal ZI_P from the specific circuit of the chip pad DQS_pad. The control logic unit 110 is further responsible for the generation of a DQS original control signal TNI (or a DQS window start signal TNI_S).

Figure 2:
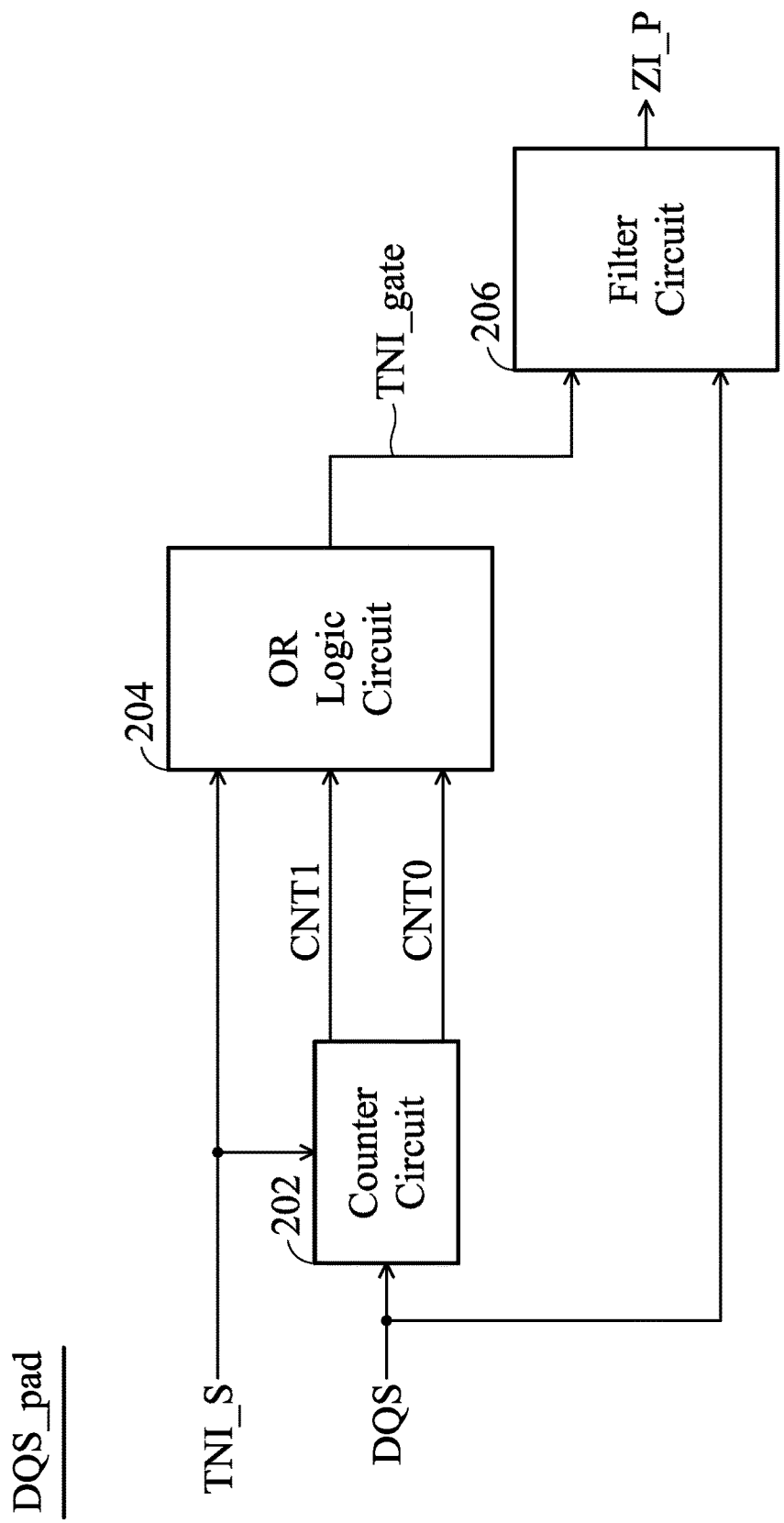
FIG. 2 is a block diagram depicting a chip pad DQS_pad in accordance with an exemplary embodiment of the disclosure which is an input and output section of the chip 100.

FIG. 2 is a block diagram depicting the chip pad DQS_pad in accordance with an exemplary embodiment of the disclosure which is an input and output section of the chip 100. The chip pad DQS_Pad has a counter circuit 202, an OR logic circuit 204 and a filter circuit 206.

A data strobe signal DQS is transmitted from the storage device 104. The counter circuit 202 counts falling edges of the data strobe signal DQS within a valid region of the data strobe signal DQS and thereby outputs counting signals CNT0 and CNT1. A DQS window start signal TNI_S is provided to direct the counter circuit 202 to start counting certainly on the valid region of the data strobe signal DQS. The DQS window start signal TNI_S is kept asserted (e.g. high level) until at least one of the counting signals CNT0 and CNT1 changes due to the counting. The OR logic circuit 204 receives the counting signals CNT0 and CNT1 as well as the DQS window start signal TNI_S to generate a DQS window signal TNI_gate. In this manner, the state of the DQS window signal TNI_gate further depends on the variation of the counting signals CNT0 and CNT1. The DQS window signal TNI_gate, therefore, is deasserted at the last (final) falling edge of the data strobe signal DQS within the valid region, so that the gating window for the data strobe signal DQS to pass is quickly closed. The filter circuit 206 gates the data strobe signal DQS in accordance with the DQS window signal TNI_gate. The gated data strobe signal ZI_P contains only the oscillations within the valid region. Instead of the data strobe signal DQS, the gated data strobe signal ZI_P is transmitted to the control logic unit (not shown) of the storage controller 102.

Figure 3:
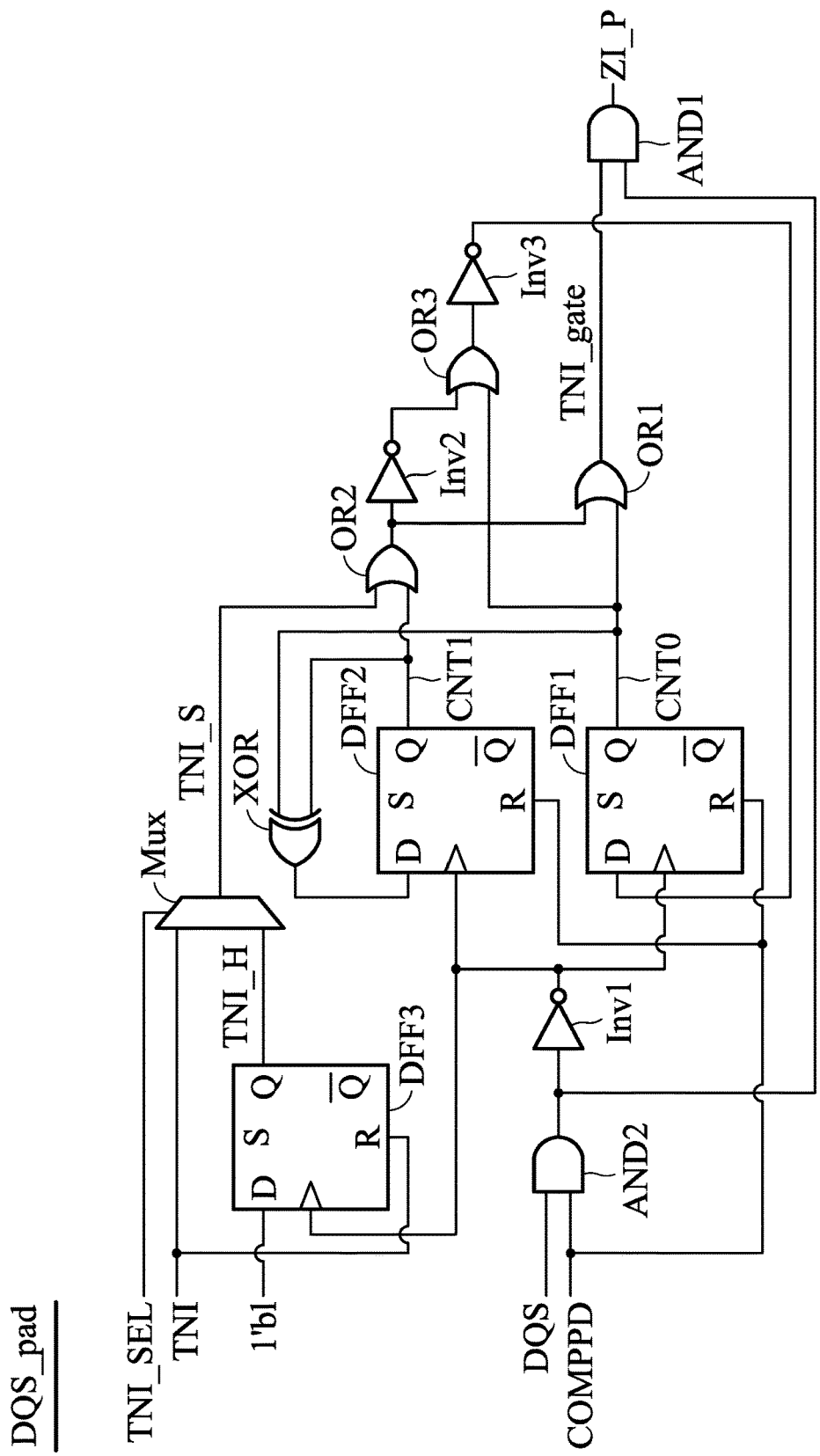
FIG. 3 depicts components installed within the chip pad DQS_pad in accordance with an exemplary embodiment of the disclosure.

FIG. 3 depicts components installed within the chip pad DQS_pad in accordance with an exemplary embodiment of the disclosure, and FIG. 3 is discussed with respect to FIG. 2.

As shown in FIG. 3, the OR logic circuit 204 may be implemented by an OR gate OR1 and an OR gate OR2. The OR gate OR1 has a first input terminal as being CNT0 (Q output of DFF1, a low-bit signal CNT0 between the counting signals CNT0 and CNT1) and a second input terminal as the output of OR2. The OR gate OR2 has a first input terminal as being CNT1 (Q output of DFF2, a high-bit signal CNT1 between the counting signals CNT0 and CNT1) and a second input terminal as being DQS window start signal TNI_S. The DQS window signal TNI_gate is provided from an output terminal of the OR gate OR1.

As shown in FIG. 3, the counter circuit 202 may be implemented by two D-flip-flops DFF1 and DFF2, three inverters Inv1, Inv2 and Inv3, an OR gate OR3 and an exclusive OR gate XOR. The data strobe signal DQS may be processed in advance (as shown in FIG. 3, being processed by an AND gate AND2) before being coupled to the inverter Inv1. The AND gate AND2 is optional. In some exemplary embodiments, the data strobe signal DQS is not processed in advance before being coupled to the inverter Inv1. Through the inverter Inv1, the data strobe signal DQS is coupled to a clock input terminal of the D-flip-flop DFF1 as well as a clock input terminal of the D-flip-flop DFF2. The D-flip-flop DFF1 has an output terminal Q that outputs the low-bit signal CNT0. The D-flip-flop DFF2 has an output terminal Q that outputs the high-bit signal CNT1. The exclusive OR gate XOR receives the low-bit signal CNT0 and the high-bit terminal CNT1 and generates a signal to be transmitted to an input terminal D of the D-flip-flop DFF2. The OR gate OR3 has a first input terminal coupled to the low-bit signal CNT0. The inverter Inv2 couples the output terminal of the OR gate OR2 to a second input terminal of the OR gate OR3. The inverter Inv3 couples an output terminal of the OR gate OR3 to an input terminal D of the D-flip-flop DFF1. Furthermore, in the exemplary embodiment shown in FIG. 3, the D flip-flop DFF1 and the D flip-flop DFF2 are reset in accordance with a reset signal COMPPD before the valid region of the data strobe signal DQS. In an exemplary embodiment, the reset signal COMPPD is asserted (e.g. changed to high level) before the valid region of the data strobe signal DQS by 2T to 3T. The reset signal COMPPD may be provided by hardware within the storage controller 102.

As shown in FIG. 3, the filter circuit 206 may be implemented by an AND gate AND1. The AND gate AND1 has a first input terminal receiving the DQS window signal TNI_gate and a second input terminal as being a coupled signal of DQS and COMPPD. The gated data strobe signal ZI_P is provided from the output terminal of the AND gate AND1. As shown (not intended to limit thereto), the filter circuit 206 further comprises an AND gate AND2. The AND gate AND2 has a first input terminal receiving the data strobe signal DQS, a second input terminal receiving the reset signal COMPPD, and an output terminal coupled to the second input terminal of the AND gate AND1.

In addition to being kept asserted until at least one of the counting signals CNT0 and CNT1 changes due to the counting, there are some other design rules for the DQS window start signal TNI_S. The data strobe signal DQS transmitted from the storage device 104 has a preamble region prior to the valid region. The preamble region has a low-level interval. The low-level interval is provided before the oscillations of the valid region of the data strobe signal DQS, which is discussed in the following with the corresponding waveforms. The DQS window start signal TNI_S is controlled by the control logic unit (not shown) within the storage controller 102. In an exemplary embodiment, the DQS window start signal TNI_S is asserted (e.g. changed to high level) by the storage controller 102 within the low-level region of the data strobe signal DQS. For example, the DQS window start signal TNI_S is asserted by asserting a DQS original control signal TNI. In another exemplary embodiment, the storage controller 102 asserts the DQS original control signal TNI before the low-level interval (e.g. within a high-level interval before the low-level interval), and at the falling edge that the data strobe signal DQS enters the low-level interval, the DQS window start signal TNI_S is asserted (e.g. raised high level) to follow the state of the DQS original control signal TNI. FIG. 3 also shows the generation circuit for the DQS window start signal TNI_S, which includes a D-flip-flop DFF3 and a multiplexer Mux.

The multiplexer Mux has a first input terminal that receives the DQS original control signal TNI. The data strobe signal DQS is inverted (e.g., through the first inverter Inv1 or even further through the AND gate AND2) and then coupled to a clock input terminal of the D-flip-flop DFF3. An input terminal D of the D-flip-flop DFF3 receives a signal 1'b1 (which may be replaced by other signals in other exemplary embodiments). The D-flip-flop DFF3 is reset in accordance with the DQS original control signal TNI. The D-flip-flop DFF3 has an output terminal Q that outputs a signal TNI_H to be coupled to a second input terminal of the multiplexer Mux. The multiplexer Mux has an output terminal that provides the DQS window start signal TNI_S.

The oscillation period of the data strobe signal DQS is T. When the preamble region of the data strobe signal DQS is 1T long (e.g. lasting high level for 0.5T and switched to low level and lasting low level for 0.5T), the control logic unit (not shown) of the storage controller 102 asserts the DQS original control signal TNI through hardware calibration within a low-level interval (e.g. the 0.5T low-level interval) within the preamble region of the data strobe signal DQS. In this case, the multiplexer Mux outputs the DQS original control signal TNI as the DQS window start signal TNI_S. When the preamble region of the data strobe signal DQS is 2T long (e.g. lasting high level for 1.5T and switched to low level and lasting low level for 0.5T), the control logic unit (not shown) of the storage controller 102 asserts the DQS original control signal TNI through hardware calibration before the low-level interval of the preamble region of the data strobe signal DQS. For example, the DQS original control signal TNI may be asserted within the 1.5T high-level interval. In this case, the DQS original control signal TNI is not directly used as the DQS window start signal TNI_S. Instead, the DQS original control signal TNI works as a reset signal for the D-flip-flop DFF3 and the D-flip-flop DFF3 outputs the signal TNI_H to be regarded as the DQS window start signal TNI_S. In comparison those embodiments which directly use the DQS original control signal TNI to work as the DQS window start signal TNI_S, a larger margin (i.e. 1.5T high-level interval) is provided for the storage controller 102 to set the DQS original control signal TNI. The D-flip-flop DFF3 is reset by the DQS original control signal TNI and has the data strobe signal DQS as the clock input. Accordingly, the signal TNI_H output from the D-flip-flop DFF3 is asserted to follow the state of the DQS original control signal TNI at the falling edge of the data strobe signal DQS at which the data strobe signal DQS enters the low-level interval. The multiplexer Mux outputs the signal TNI_H as the DQS window start signal TNI_S. A selection signal TNI_SEL is provided for switching the circuit for the 1T preamble case or for the 2T preamble case. The value of the selection signal TNI_SEL is set through a register of the storage controller 102 to correspond to a DDR3 or a low-frequency DDR4 example with a preamble region of 1T long or to correspond to a high-frequency DDR 4 example with a preamble region of 2T long.

Figure 4:
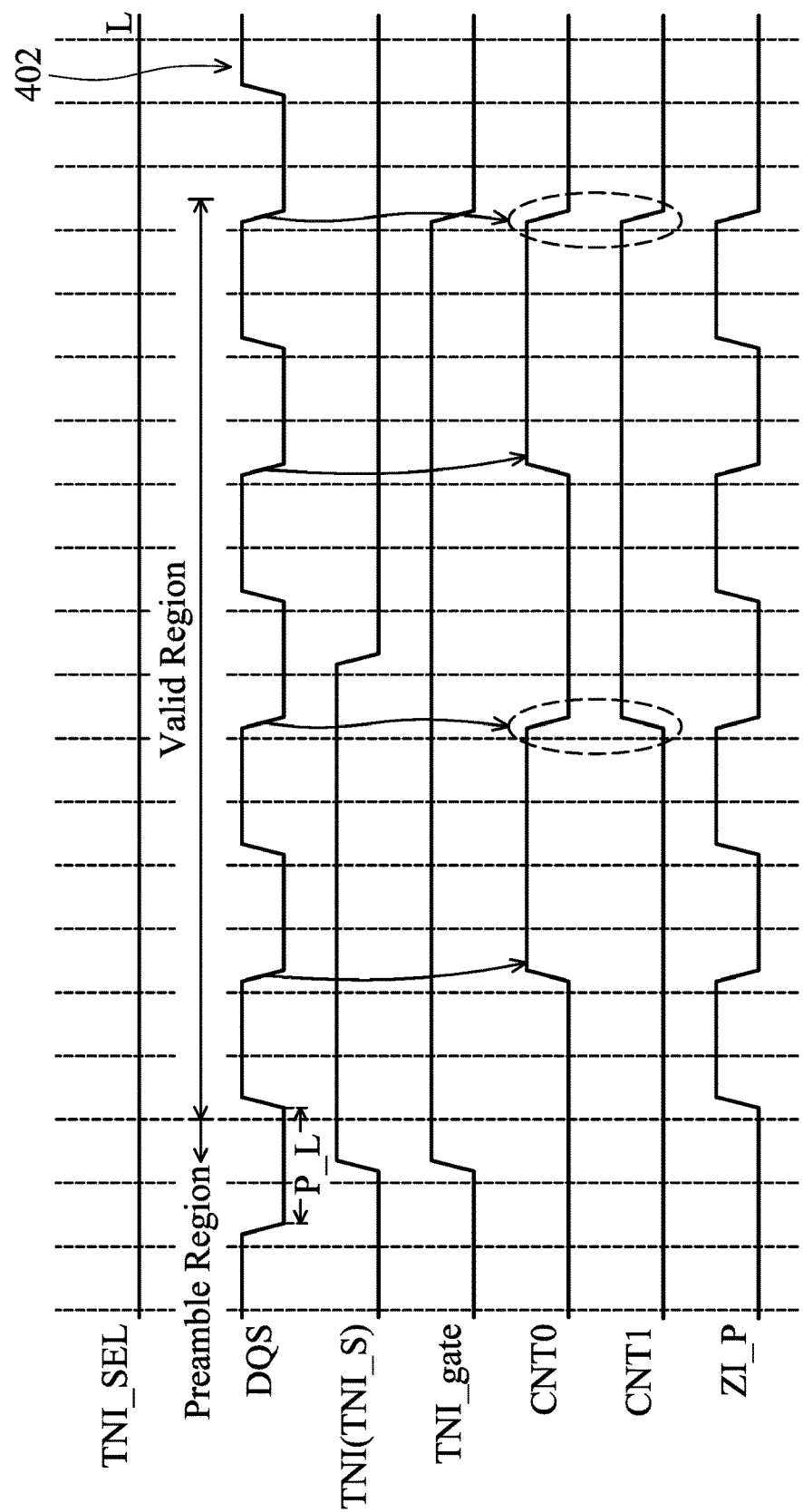
FIG. 4 shows waveforms for discussion about a 1T preamble case.

FIG. 4 shows waveforms for discussion about a 1T preamble case. The preamble region of the data strobe signal DQS is 1T long (not completely shown in FIG. 4), having a high-level interval of 0.5T and a low-level interval P_L of 0.5T. The control logic unit (not shown) of the storage controller 102 asserts the DQS original control signal TNI (raises TNI high) through hardware calibration within the low-level interval P_L of the data strobe signal DQS. The selection signal TNI_SEL is set to the low level L and thereby the multiplexer Mux outputs the DQS original control signal TNI as the DQS window start signal TNI_S. The counter circuit 202 starts counting the falling edges of the data strobe signal DQS. The counting signals (CNT1, CNT0) vary with the four valid falling edges of the data strobe signal DQS, and thereby switches from (0, 0) to (0, 1) to (1, 0) to (1, 1) and back to (0, 0). The DQS window start signal TNI_S is kept asserted at least until any of the counting signals (CNT1, CNT0) changes due to the counting (e.g., changing from (0, 0) to (0, 1)). Referring to FIG. 4, the DQS window start signal TNI_S is kept asserted longer, at least until the counting signals (CNT1, CNT0) change from (0, 1) to (1, 0). As shown, the DQS window start signal TNI_S is kept asserted even after the counting signals (CNT1, CNT0) have changed from (0, 1) to (1, 0) for a while. After performing an OR logic operation on the counting signals CNT0 and CNT1 and the DQS window start signal TNI_S, the OR logic circuit 204 outputs the DQS window signal TNI_gate that has been aligned to the valid region of the data strobe signal DQS. It means that the DQS window signal TNI_gate is quickly deasserted in accordance with the final falling edge within the valid region of the data strobe signal DQS. The filter circuit 206, therefore, correctly gates the data strobe signal DQS to obtain the gated data strobe signal ZI_P with only valid oscillations remaining therein. Specifically, the glitch 402 of the data strobe signal DQS is effectively blocked without remaining in the gated data strobe signal ZI_P.

Figure 5:
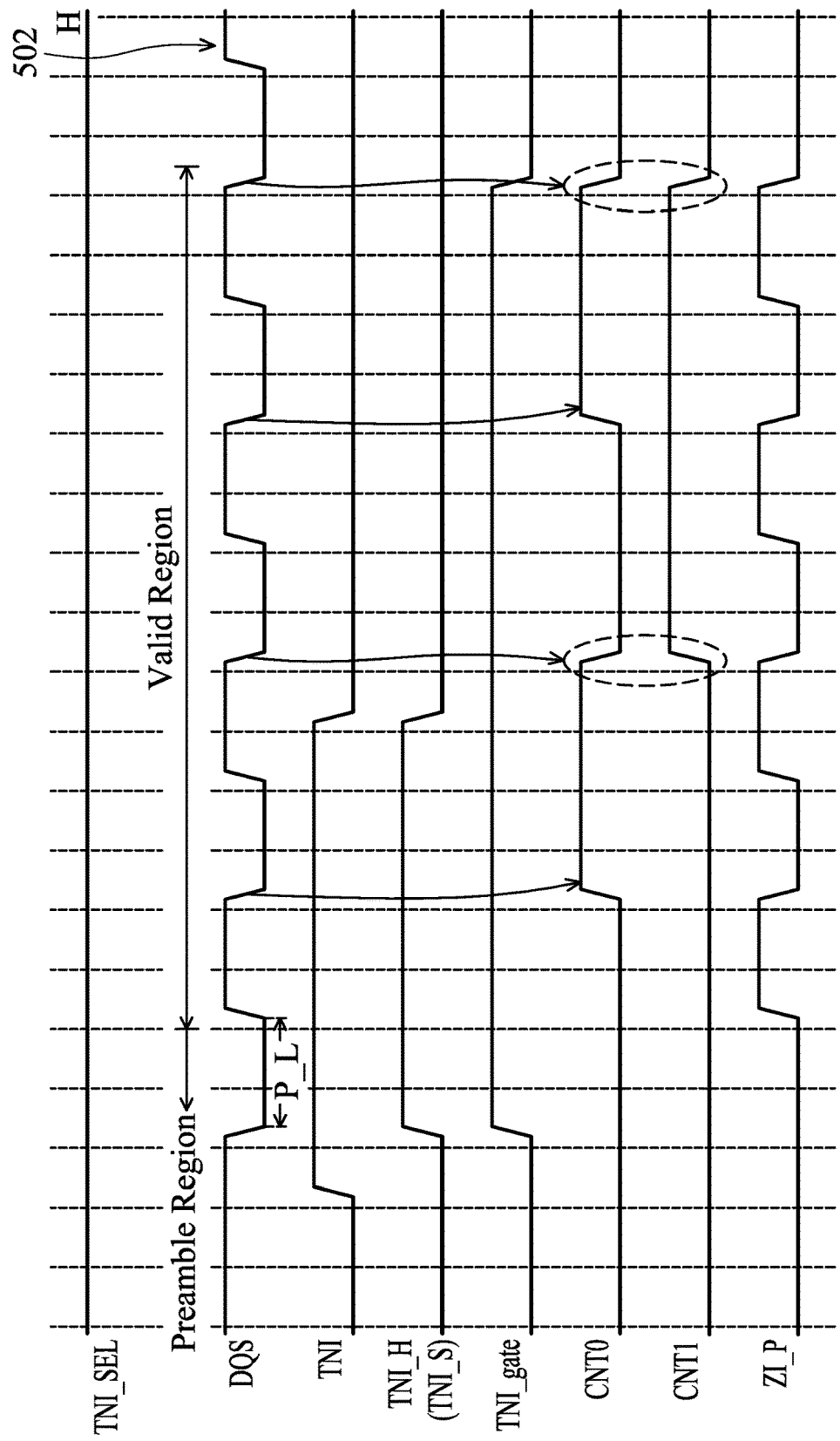
FIG. 5 shows waveforms for discussion about a 2T preamble case.

FIG. 5 shows waveforms for discussion about a 2T preamble case. The preamble region of the data strobe signal DQS is 2T long (not completely shown in FIG. 5), having a high-level interval of 1.5T and a low-level interval P_L of 0.5T. The control logic unit (not shown) of the storage controller 102 asserts the DQS original control signal TNI (raises TNI to high level) through hardware calibration within the high-level interval (before the low-level interval P_L) of the data strobe signal DQS and, through the D-flip-flop DFF3, the asserted DQS original control signal TNI is delayed and represented as the signal TNI_H. Referring back to FIG. 3, the data strobe signal DQS is inverted (or even further processed) and then transmitted to the D-flip-flop DFF3 as a clock signal. Thus, at the falling edge where the data strobe signal DQS enters the low-level interval P_L, the D-flip-flop DFF3 asserts the signal TNI_H to follow the state of the DQS original control signal TNI. The selection signal TNI_SEL is set to the high level H and thereby the multiplexer Mux outputs the signal TNI_H as the DQS window start signal TNI_S. The counter circuit 202 starts counting the falling edges of the data strobe signal DQS. The counting signals (CNT1, CNT0) vary with the four valid falling edges of the data strobe signal DQS, and thereby switches from (0, 0) to (0, 1) to (1, 0) to (1, 1) and back to (0, 0). The DQS window start signal TNI_S is kept asserted at least until any of the counting signals (CNT1, CNT0) changes due to the counting (e.g., changing from (0, 0) to (0, 1), which means CNT0 begins to change). Referring to FIG. 5, the DQS window start signal TNI_S is kept asserted longer, even after the counting signals (CNT1, CNT0) have changed from (0, 0) to (0, 1). After performing an OR logic operation on the counting signals CNT0 and CNT1 and the DQS window start signal TNI_S, the OR logic circuit 204 outputs the DQS window signal TNI_gate that has been aligned to the valid region of the data strobe signal DQS. It means that the DQS window signal TNI_gate is quickly deasserted in accordance with the final falling edge within the valid region of the data strobe signal DQS. The filter circuit 206, therefore, correctly gates the data strobe signal DQS to obtain the gated data strobe signal ZI_P with only valid oscillations remaining therein. Specifically, the glitch 502 of the data strobe signal DQS is effectively blocked without remaining in the gated data strobe signal ZI_P.

Note that in the exemplary embodiments with a preamble region of 2T long, the high-level interval of the data strobe signal DQS is 1.5T long. The 1.5T long time interval is quite sufficient for the storage controller 102 to assert the DQS original control signal TNI. The signal TNI_H, therefore, is asserted early to open the gating window to quickly pass the data strobe signal DQS. As shown in FIG. 5, the rising edge of the signal TNI_H and the rising edge of the DQS window signal TNI_gate both lead the first valid rising edge of the data strobe signal DQS by 0.5T. The gating window is quickly opened. When the storage device 102 is a DDR4 which is a high-frequency device, the early opened gating window ensures the correct timing for retrieving data. In the case shown in FIG. 4, the rising edge of the signal TNI_S and the rising edge of the DQS window signal TNI_gate both lead the first valid rising edge of the data strobe signal DQS by only 0.25T, which is, however, still sufficient for low-frequency devices.

In other exemplary embodiments, the circuit of FIG. 3 installed between the storage device 104 and the storage controller 102 is not limited to being installed within a chip pad. In an exemplary embodiment, the aforementioned circuits are provided outside the chip 100 and between the storage device 104 and the chip pad DQS_pad. In another exemplary embodiment, the circuits are manufactured between the chip pad DQS_pad and the storage controller 102.

Note that instead of complex logic circuits the aforementioned data strobe signal processing systems and methods use simple logic gates to generate the DQS window signal TNI_gate to filter the data strobe signal DQS. The simple logic gates (especially those implemented within an input and output section of the storage controller) is capable of directly receiving the data strobe signal DQS transmitted from the storage device 104. No delay is introduced by the simple logic gates and it is ensured that the DQS window signal TNI_gate is quickly closed in accordance with the last falling edge within the valid region of the data strobe signal DQS. Thus, the glitch of the data strobe signal DQS is effectively blocked.

Data strobe signal DQS processing techniques based on the forgoing concepts are within the scope of the disclosure. A data strobe signal processing method in accordance with an exemplary embodiment of the disclosure is discussed with respect to FIG. 2, comprising the following steps: counting falling edges of a data strobe signal DQS within a valid region of the data strobe signal DQS to generate a plurality of counting signals CNT0 and CNT1, wherein the data strobe signal DQS is transmitted from a storage device 104; processing the plurality of counting signals CNT0 and CNT1 and a DQS window start signal TNI_S by an OR logic operation to generate a DQS window signal TNI_gate; and gating the data strobe signal DQS in accordance with the DQS window signal TNI_gate to obtain the gated data strobe signal ZI_P, which is provided to the storage controller 102 for use. The DQS window start signal TNI_gate is kept asserted until at least one of the counting signals CNT0 and CNT1 changes due to the counting.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data strobe signal processing system, implemented within an input and output section of a storage controller, comprising:
   a counter circuit, started by a data strobe signal (DQS) window start signal to count falling edges of a data strobe signal to output a plurality of counting signals forming a binary representation of a counted number of the falling edges, wherein the data strobe signal is transmitted from a storage device;
   an OR logic circuit, receiving the plurality of counting signals and the DQS window start signal to perform an OR logic operation on the plurality of counting signals and the DQS window start signal to generate a DQS window signal;
   a filter circuit, gating the data strobe signal in accordance with the DQS window signal,
   wherein the DQS window start signal is deasserted in response to at least one of the counting signals is changed by the counter circuit.

2. The data strobe signal processing system as claimed in claim 1, wherein:
   the OR logic circuit further comprises a first OR gate and a second OR gate;
   the first OR gate has a first input terminal receiving a low-bit signal among the plurality of counting signals and a second input terminal coupled to an output terminal of the second OR gate;
   the second OR gate has a first input terminal receiving a high-bit signal among the plurality of counting signals and a second signal coupled to the DQS window start signal; and
   the DQS window signal is provided from an output terminal of the first OR gate.

3. The data strobe signal processing system as claimed in claim 2, wherein the counter circuit comprises:
   a first D-flip-flop and a second D-flip-flop;
   a first inverter, coupling the data strobe signal to a clock input terminal of the first D-flip-flop and a clock input of the second D-flip-flop;
   a second inverter and a third inverter;
   a third OR gate; and
   an exclusive OR gate,
   wherein:
   the low-bit signal is provided from an output terminal of the first D-flip-flop;
   the high-bit signal is provided from an output terminal of the second D-flip-flop;
   the exclusive OR gate receives the low-bit signal and the high-bit signal and generates a signal to be coupled to an input terminal of the second D-flip-flop;
   the third OR gate has a first input terminal coupled to the low-bit signal and the second inverter couples the output terminal of the second OR gate to a second input terminal of the third OR gate; and
   the third inverter couples an output terminal of the third OR gate to an input terminal of the first D-flip-flop.

4. The data strobe signal processing system as claimed in claim 3, wherein:
   the first D-flip-flop and the second D-flip-flop is reset before a valid region of the data strobe signal in accordance with a reset signal.

5. The data strobe signal processing system as claimed in claim 1, wherein:
   the filter circuit comprises a first AND gate; and
   the first AND gate has a first input terminal coupled to the DQS window signal and a second input terminal coupled to the data strobe signal.

6. The data strobe signal processing system as claimed in claim 1, wherein:
   the DQS window signal is deasserted according to a final falling edge of the plurality of counting signals within a valid region of the data strobe signal.

7. The data strobe signal processing system as claimed in claim 1, wherein:
   the DQS window start signal is asserted by a control logic unit of the storage controller within a low-level interval of a preamble region of the data strobe signal.

8. The data strobe signal processing system as claimed in claim 1, wherein:

the storage controller has a control logic unit that asserts a DQS original control signal before a low-level interval of a preamble region of the data strobe signal; and the DQS window start signal is asserted as the DQS original control signal at a falling edge of the data strobe signal that enters the low-level interval.

9. The data strobe signal processing system as claimed in claim 1, further comprising a third D-flip-flop, wherein:

after being inverted, the data strobe signal is coupled to a clock input terminal of the third D-flip-flop;

the third D-flip-flop is reset before a low-level interval of a preamble region of the data strobe signal; and the third D-flip-flop has an output terminal providing the DQS window start signal.

10. The data strobe signal processing system as claimed in claim 1, wherein:

the storage controller has a control logic unit for asserting a DQS original control signal;

when a preamble region of the data strobe signal is 1T long, the DQS original control signal is asserted within a low-level interval of the preamble region;

when the preamble region of the data strobe signal is 2T long, the DQS original control signal is asserted before the low-level interval; and T is oscillation period of the data strobe signal.

11. The data strobe signal processing system as claimed in claim 10, further comprising a multiplexer and a third D-flip-flop, wherein:

the multiplexer has a first input terminal receiving the DQS original control signal;

after being inverted, the data strobe signal is coupled to a clock input terminal of the third D-flip-flop;

the third D-flip-flop is reset according to the DQS original control signal;

the third D-flip-flop has an output terminal coupled to a second input terminal of the multiplexer; and the multiplexer has an output terminal providing the DQS window start signal.

12. The data strobe signal processing system as claimed in claim 1, wherein the storage controller is implemented within a chip, and the input and output section is a chip pad of the chip.

13. The data strobe signal processing system as claimed in claim 1, wherein the storage controller has a control logic unit receiving the data strobe signal that has been gated by the filter circuit.

14. A data strobe signal processing method, comprising:

counting, started by a data strobe signal (DQS) window start signal, falling edges of a data strobe signal to generate a plurality of counting signals forming a binary representation of a counted number of the falling edges, wherein the data strobe signal is transmitted from a storage device;

using an OR logic circuit to receive the plurality of counting signals and the DQS window start signal to perform an OR logic operation on the plurality of counting signals and the DQS window start signal to generate a DQS window signal; and gating the data strobe signal in accordance with the DQS window signal, wherein the DQS window start signal is deasserted in response to at least one of the counting signals changes due to the counting.

15. The data strobe signal processing method as claimed in claim 14, wherein:

the DQS window signal is deasserted according to a final falling edge of the plurality of counting signals within a valid region of the data strobe signal.

16. The data strobe signal processing method as claimed in claim 14, wherein:

the DQS window start signal is asserted by a control logic unit of a storage controller within a low-level interval of a preamble region of the data strobe signal.

17. The data strobe signal processing method as claimed in claim 14, further comprising:

operating a control logic unit of a storage controller to assert a DQS original control signal before a low-level interval of a preamble region of the data strobe signal, wherein the DQS window start signal is asserted as the DQS original control signal at a falling edge of the data strobe signal that enters the low-level interval.

18. The data strobe signal processing method as claimed in claim 14, further comprising:

operating a control logic unit of a storage controller to assert a DQS original control signal;

asserting the DQS original control signal within a low-level interval of a preamble region of the data strobe signal when the preamble region is 1T long; and asserting the DQS original control signal before the low-level interval when the preamble region of the data strobe signal is 2T long, wherein T is oscillation period of the data strobe signal.

19. The data strobe signal processing method as claimed in claim 14, further comprising:

recognizing a DQS original control signal as the DQS window start signal when a preamble region of the data strobe signal is 1T long; and when the preamble region is 2T long, changing the DQS window start signal as the DQS original control signal at a falling edge of the data strobe signal that enters a low-level interval of the preamble region, wherein:

T is oscillation period of the data strobe signal; and the DQS original control signal is controlled by a control logic unit of a storage controller.

* * * * *